(12) United States Patent
Zhao et al.

(10) Patent No.: US 8,748,256 B2
(45) Date of Patent: Jun. 10, 2014

(54) INTEGRATED CIRCUIT HAVING SILICIDE BLOCK RESISTOR

(75) Inventors: Song Zhao, Plano, TX (US); Gregory Charles Baldwin, Plano, TX (US); Shashank S. Ekbote, Allen, TX (US); Youn Sung Choi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/366,903

(22) Filed: Feb. 6, 2012

(65) Prior Publication Data

US 2013/0200466 A1 Aug. 8, 2013

(51) Int. Cl.
*H01L 27/088* (2006.01)

(52) U.S. Cl.
USPC ........... 438/238; 438/664; 438/400; 438/210; 438/285; 438/587; 257/368; 257/369; 257/380; 257/288; 257/412; 257/E21.328; 257/E21.409; 257/E21.621; 257/E21.637; 257/E21.679

(58) Field of Classification Search
CPC ............... H01L 21/26586; H01L 21/823807; H01L 21/823814; H01L 21/823462; H01L 29/7833; H01L 21/82385; H01L 21/28035; H01L 21/823828; H01L 29/6659
USPC ........... 257/402, 336, 371, 380, 18, 196, 384, 257/408, E21.696, E27.09, E21.43, 257/E21.444, E29.04, E29.255; 438/218, 438/722, 301, 305
See application file for complete search history.

(56) References Cited

U.S. PATENT DOCUMENTS

| 4,835,112 | A * | 5/1989 | Pfiester et al. | 438/305 |
| 6,591,409 | B2 | 7/2003 | Kamath et al. | |
| 6,730,554 | B1 * | 5/2004 | Baldwin et al. | 438/210 |
| 6,822,297 | B2 | 11/2004 | Nandakumar et al. | |
| 2004/0173855 | A1 * | 9/2004 | Masuoka et al. | 257/371 |
| 2007/0284615 | A1 * | 12/2007 | Ku et al. | 257/196 |
| 2008/0217741 | A1 | 9/2008 | Young et al. | |
| 2009/0159992 | A1 * | 6/2009 | Pawlak | 257/412 |
| 2010/0105185 | A1 * | 4/2010 | Ku et al. | 438/301 |
| 2010/0200935 | A1 * | 8/2010 | Hokazono | 257/408 |
| 2010/0255668 | A1 * | 10/2010 | Nomura et al. | 438/587 |
| 2011/0006354 | A1 * | 1/2011 | Jangjian et al. | 257/314 |

* cited by examiner

*Primary Examiner* — Jerome Jackson, Jr.
*Assistant Examiner* — Bo Fan
(74) *Attorney, Agent, or Firm* — Jacqueline J. Garner; Wade J. Brady, III; Frederick J. Telecky, Jr.

(57) ABSTRACT

A method for forming an integrated circuit (IC) including a silicide block poly resistor (SIBLK poly resistor) includes forming a dielectric isolation region in a top semiconductor surface of a substrate. A polysilicon layer is formed including patterned resistor polysilicon on the dielectric isolation region and gate polysilicon on the top semiconductor surface. Implanting is performed using a first shared metal-oxide-semiconductor (MOS)/resistor polysilicon implant level for simultaneously implanting the patterned resistor polysilicon and gate polysilicon of a MOS transistor with at least a first dopant. Implanting is then performed using a second shared MOS/resistor polysilicon implant level for simultaneously implanting the patterned resistor polysilicon, gate polysilicon and source and drain regions of the MOS transistor with at least a second dopant. A metal silicide is formed on a first and second portion of a top surface of the patterned resistor polysilicon to form the SIBLK poly resistor.

11 Claims, 4 Drawing Sheets

INTEGRATED CIRCUIT HAVING SILICIDE BLOCK RESISTOR

FIELD

Disclosed embodiments relate to integrated circuits (ICs) having silicide block polycrystalline silicon resistors and methods for forming the same.

BACKGROUND

Mixed signal ICs often require integrated resistors for proper circuit operation. Typically such resistors comprised doped polycrystalline silicon. Metal oxide semiconductor (MOS) transistors, which are also present on the mixed signal ICs, have a gate electrode that also can comprise doped polycrystalline silicon. To lower the resistances present in the MOS transistor a metal silicide layer can be formed on the polysilicon gate electrode of the MOS transistor.

To enable contact with metal electrodes and reduce the contact resistance, metal silicide layers are also formed on the source and drain regions of the MOS transistor and the doped polycrystalline silicon resistors to form what can be referred to as silicide block poly resistors (SIBLK poly resistors). The metal silicide layer can be formed across the top of the doped polycrystalline silicon or be blocked from formation across the top of the doped polycrystalline silicon. This metal silicide option enables two different types of polycrystalline silicon resistors.

The first type with the metal silicide layer across the top of the doped polycrystalline silicon is referred as a "silicided polycrystalline silicon resistor", and the electrical conduction of this resistor is via the metal silicide layer. The second type without the metal silicide layer across the top of the doped polycrystalline silicon is referred as a silicide block polycrystalline silicon resistors (SIBLK poly resistor). The electrical conduction for the second type is by the polycrystalline silicon, thus depending on the doping into the polycrystalline silicon. For proper contact of the SIBLK poly resistor to the metal interconnect, "heads" of the SIBLK poly resistor are provided that include a metal silicide strip on top of the polycrystalline silicon poly in the head regions to provide the first and second contacts.

A typical SIBLK poly resistor thus comprises three parts, a first head, the body, and a second head. The resistor body is strictly blocked from metal silicide layer formation on top. The head receives metal silicide to enable contact to the metal interconnect. Significant parameters for SIBLK poly resistors are body sheet resistance (Rsh), thermal coefficient of resistance (TCR), and head resistance (Rhead). In addition to the Rsh it is generally desirable for the SIBLK poly resistors to exhibit a low thermal coefficient of resistance (TCR) allowing proper IC operation over a wide range of temperature (e.g., $-50°$ C. to $150°$ C.). Doping of the SIBLK poly resistor is known to influence the SIBLK poly resistor's TCR and Rsh.

To minimize processing steps and thus cycle time and expense, a single-step ion implant (boron for P+ doping or phosphorous for N+ doping) that provides the source/drain doping for the p-channel metal-oxide-semiconductor (PMOS) transistors or n-channel MOS (NMOS) transistors is generally used to also simultaneously dope the SIBLK poly resistors. To minimize processing steps and thus cycle time and expense, as an alternative option, a single-step pre-gate doping, such as an n-poly implant (e.g., phosphorus) used for the poly gates of the NMOS or p-poly (e.g., boron) for the poly gates of the PMOS can also be used to dope the SIBLK poly resistor.

However, due to use of a single shared step implant for the PMOS or NMOS transistors and SIBLK poly resistors, current IC manufacturing methods impose a tradeoff between SIBLK poly resistor properties (e.g., Rsh and TCR) and MOS transistor performance (e.g., gate leakage at "on" state, Idrive, and total leakage at "off" state (Ioff)). Although the implants for the SIBLK poly resistor and source/drains for the MOS transistor can be separate implants to eliminate this tradeoff in properties by using additional masks, the extra processing results in added cycle time and expense.

SUMMARY

Disclosed embodiments include methods for forming an integrated circuit (IC) including silicide block poly resistors (SIBLK poly resistors) that removes the above described performance tradeoff between metal-oxide-semiconductor (MOS) transistors and SIBLK poly resistors, without the need to add any additional masks, and ICs therefrom. A dielectric isolation region is formed in a top semiconductor surface of a substrate (e.g., wafer). A polysilicon layer is formed including patterned resistor polysilicon that will be part of the SIBLK poly resistors on the dielectric isolation region, while the gate polysilicon will generally be part of the MOS transistors on the top semiconductor surface.

The SIBLK poly resistors receive multiple implants at multiple process levels. Implanting is performed using a first shared MOS/resistor polysilicon implant level for simultaneously implanting the patterned resistor polysilicon and polysilicon gate of one type of the MOS transistors before etch/patterning with at least a first dopant. In one embodiment the first dopant is n-type, the SIBLK poly resistor is n-doped, and the MOS transistor is an n-channel MOS transistor (NMOS). In another embodiment the first dopant species is p-type, the SIBLK poly resistor is p-doped, and the MOS transistor is a p-channel MOS transistor (PMOS). As used herein, a "dopant" relative to the substrate lattice is either n-type having one extra electron, or p-type having a one electron deficiency, as opposed to a neutral or electrically inactive dopants which are neither n-type or p-type (e.g., neutral: such as C, Ge, or electrically inactive such as N).

The gate polysilicon is then patterned, followed by polycrystalline silicon oxidation (poly-ox) and lightly doped drain (LDD) anneals shared with the MOS transistor process flow. Implanting is then performed using a second shared MOS/resistor polysilicon implant level for simultaneously implanting the patterned resistor polysilicon, patterned gate polysilicon and source and drain regions of the MOS transistor with at a second dopant. Source and drain anneal(s) are then shared with MOS transistors. A metal silicide is formed on the top polysilicon surface in first and second portions of the top surface of the SIBLK poly resistor to provide two head regions to provide first and second resistor contacts, and the metal silicide is blocked in the top poly surface of the body region, to form the SIBLK poly resistor.

Disclosed methods achieve low and tunable TCR and sheet resistance (Rsh) for SIBLK poly resistors (see FIG. 3 described below for the n-doped SIBLK poly resistor and n-channel MOS transistor embodiment) and low sensitivity of SIBLK poly resistor Rsh and thermal coefficient of resistance (TCR) to S/D anneal temp, without any measurable performance degradation to MOS transistors (e.g., both core and Input/Output (IO) transistors). Disclosed methods can also reduce gate leakage current (Jg) of the MOS transistors.

DETAILED DESCRIPTION

Figure 1A:
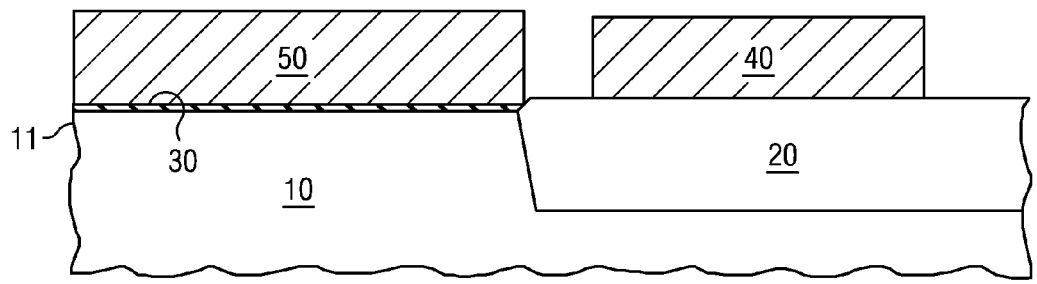
FIG. 1a-1f are cross-sectional diagrams showing processing progression for an example method of forming an integrated circuit (IC) having a MOS transistor and a SIBLK poly resistor, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

An example method of forming an IC having a SIBLK poly resistor will be described for the embodiment the SIBLK poly resistor is n-doped, and the MOS transistor formed by the shared implants is a NMOS transistor, using the MOS transistor and a SIBLK poly resistor shown in FIGS. 1a to 1f. It is understood however, as described below, that the SIBLK poly resistor can be p-doped, and the MOS transistor formed by the shared implants can be a PMOS transistor. Moreover, it is intended that this Disclosure should not be limited to the case of a single MOS transistor and SIBLK poly resistor. Disclosed embodiments can be used to form ICs including any number of SIBLK poly resistors in combination with any number of MOS transistors and types of MOS transistors along with any other IC devices (e.g. bipolar transistors) or structures (e.g., capacitors).

A dielectric isolation region 20 is formed in a substrate 10 (e.g., wafer) having a top semiconductor surface 11, such as a silicon comprising surface, shown of a bulk semiconductor substrate 10 in FIG. 1a. The dielectric isolation region 20 can comprises a shallow trench isolation (STI) structure formed using known semiconductor processing methods. In an embodiment the STI structure comprises silicon oxide, but any suitable dielectric material can be used to form the dielectric isolation region 20. In addition to STI other isolation structures such as localized oxidation (LOCOS) can be used to form the dielectric isolation region 20 shown in FIG. 1a.

A dielectric layer 30 is formed on the top semiconductor surface 11 of the semiconductor substrate 10 lateral to the dielectric isolation region 20. The dielectric layer 30 can be about 8 to 150 angstroms thick, such as between 10 and 45 angstroms thick, and optionally used as the gate dielectric for the MOS transistor to be formed. The dielectric layer 30 can be formed using silicon oxide, silicon nitride, silicon oxynitride, any combination of these materials, or any other suitable dielectric material. In addition high-k dielectrics such as $HfO_2$, $ZrO_2$, $Al_2O_3$, silicates, aluminates, HfSiON, any combination of these materials, or any other suitable high-k dielectric can also be used to form the dielectric layer 30.

Following the formation of the dielectric layer 30, a blanket polycrystalline silicon (herein after polysilicon) layer is formed (e.g., deposited) and is then patterned to provide a polysilicon layer comprising patterned resistor polysilicon 40, while the gate polysilicon 50 remains unpatterned as shown in FIG. 1a. The resistor polysilicon 40 and gate polysilicon 50 can be between 500 and 2,500 angstroms thick. The MOS transistor gate will be formed using gate polysilicon 50 after patterning and the SIBLK poly resistor will be formed using resistor polysilicon 40.

Figure 1B:
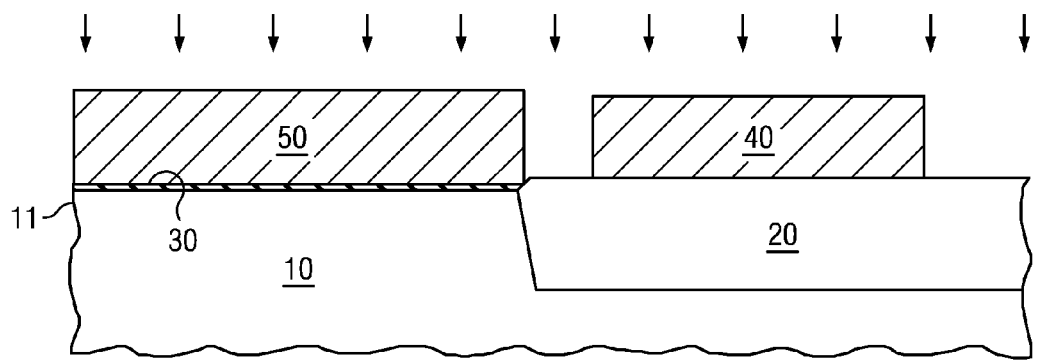

Following the formation of the patterned resistor polysilicon 40, as shown in FIG. 1b, dopant species are implanted using a first shared MOS/resistor polysilicon implant level that implants species including a first dopant into the top semiconductor surface 11 to dope the unpatterned gate polysilicon 50 and simultaneously implant into the patterned resistor polysilicon 40. The first shared implant level can comprise at least two implants including at least a first co-dopant, such as Ge, where implanting Ge functions as a pre-amorphization implant (PAI). The first shared implant can include other neutral and electrically inactive dopants, such as C and N.

Ge when included functions as a PAI to avoid possible n-dopant (As, P) penetration through the gate dielectric layer 30. In one particular embodiment, both P and As are used as first dopant, along with Ge and N as neutral and electrically inactive dopants. One first shared implant sequence is Ge, then As, then P, then N. N as a neutral dopant has been recognized to provide SIBLK poly resistor TCR reduction and gate-oxide leakage (Jg) reduction for MOS transistors.

The Ge implant parameters at the first shared implant level are generally at a dose from $5\times10^{13}$ $cm^{-2}$ to $1\times10^{15}$ $cm^{-2}$ at 10 to 30 keV, such as $3\times10^{14}$ $cm^{-2}$ to $7\times10^{14}$ $cm^{-2}$ at 12 to 18 keV. For embodiments where the SIBLK poly resistor is n-doped, and the MOS transistor is a NMOS transistor, the P implant parameters can comprise a dose from $1\times10^{15}$ $cm^{-2}$ to $1\times10^{16}$ $cm^{-2}$ at 1 to 12 keV, such as $3\times10^{15}$ $cm^{-2}$ to $6\times10^{15}$ $cm^{-2}$ at 2 to 5 keV. If included at the first shared implant level, As implant parameters can comprise a dose from $7\times10^{14}$ $cm^{-2}$ to $6\times10^{15}$ $cm^{-2}$ at 5 to 25 keV, such as $1\times10^{15}$ $cm^{-2}$ to $3\times10^{15}$ $cm^{-2}$ at 10 to 15 keV, while if N is included at the first shared implant level the N implant parameters can comprise a dose from $4\times10^{14}$ $cm^{-2}$ to $6\times10^{15}$ $cm^{-2}$ at 5 to 20 keV, such as $1\times10^{15}$ $cm^{-2}$ to $2\times10^{15}$ $cm^{-2}$ at 8 to 12 keV. Carbon (C) can be included at the first shared implant. C implant parameters can comprise a dose from $5\times10^{13}$ $cm^{-2}$ to $3\times10^{15}$ $cm^{-2}$ at 2 to 10 keV, such as $1\times10^{14}$ $cm^{-2}$ to $2\times10^{15}$ $cm^{-2}$ at 4 to 8 keV.

Figure 1C:
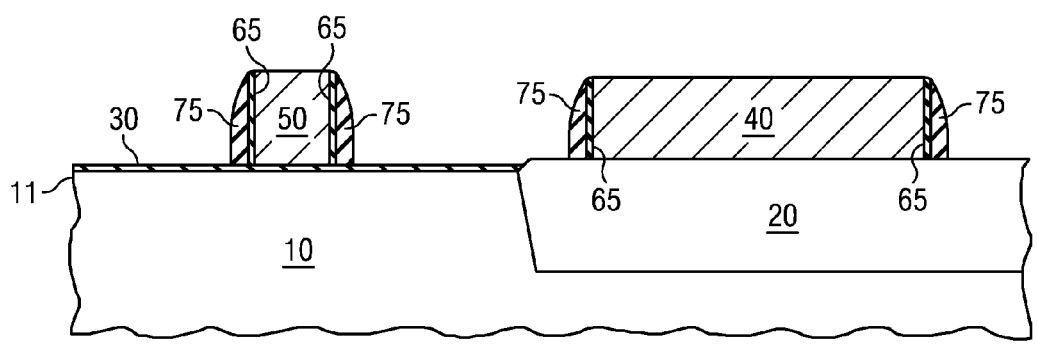

Sidewall structures can then be formed for the MOS transistors and optionally for the SIBLK poly resistors, with the resulting sidewall (spacer) structures 75/65 shown in FIG. 1c. A polysilicon oxidation process can be performed to form a silicon oxide layer such as between 5 and 60 Angstroms thick using known polysilicon oxidation methods, such as thermal oxidation, followed by a silicon nitride layer. The silicon nitride layer can be formed using known methods and can be between 20 and 120 angstroms thick.

An anisotropic etch can then be performed on the silicon nitride layer and the silicon oxide layer to form the sidewall structures 65/75 shown on the edges of resistor polysilicon 40 and the edges of the gate polysilicon 50. Following the formation of the sidewall structures 65/75, and prior to the formation of the drain and source extension regions to form lightly doped drains (LDD), a photoresist layer (not shown) will generally be used to block the implanted species from entering the complementary MOS transistor type. Therefore if the extension regions of NMOS transistors are being implanted the photoresist layer will block the PMOS transistors and vice versa. The LDD and pocket implants (if included) are blocked from the resistor polysilicon 40.

Figure 1D:
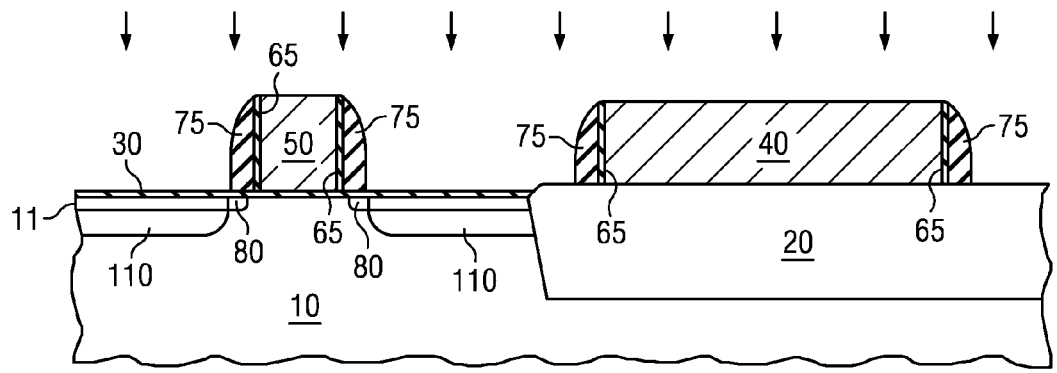

One or more anneal steps can follow the first shared implant level and be before the second shared MOS/resistor polysilicon implant level described below. Such anneal processes can comprise a first anneal at a temperature of 750° C. to 850° C., such as a furnace anneal or ISSG (In situ steam generation). To achieve $SiO_2$ layer 10 to 18 A thick, such as 12 to 15 A thick, the time can range from 30 sec to 10 min, and a second anneal comprising an LDD anneal, such as a 950° C.

spike anneal, or a laser spike anneal (LSA) at around 1100° C. to 1350° C. Following the above-described anneal(s), a second shared MOS/resistor polysilicon implant level is used to form the MOS transistor source and drain (SD) regions 110 by implanting at least a second n-type dopant species into the top semiconductor surface 11 to form n-type source and drain (SD) regions 110, as well to simultaneously again dope the resistor polysilicon 40 as shown in FIG. 1*d*. LDD regions 80 from the above-described implant and anneal processing is also shown. The second shared MOS/resistor polysilicon implant level can further comprise implanting at least one neutral or electrically inactive dopant implant along with the second-n-type dopant species, such as one or more of Ge, C and N.

In one embodiment, for the second shared implant, the dose for the n-type dopant is $5\times10^{14}$ cm$^{-2}$ to $1\times10^{16}$ cm$^{-2}$ collectively for phosphorous (P), arsenic (As) and/or antimony (Sb) species used to simultaneously form SD regions 110 that are n-type and further dope the resistor polysilicon 40 n-type. In one particular embodiment the SD implants comprise Ge, As, P and N. Ge functions as a PAI, to help form shallow junctions. The implant parameters for the second shared implant can comprise, Ge: $3\times10^{14}$ cm$^{-2}$ to $7\times10^{14}$ cm$^{-2}$ at 12 to 18 keV, As: $1\times10^{15}$ cm$^{-2}$ to $3\times10^{15}$ cm$^{-2}$ at 10 to 15 keV, P: $3\times10^{15}$ cm$^{-2}$ to $6\times10^{15}$ cm$^{-2}$ at 1.0 to 3.5 keV, and N: $1\times10^{15}$ cm$^{-2}$ to $2\times10^{15}$ cm$^{-2}$ at 8 to 12 keV. C may be included to further confine dopant profile by suppressing the transient enhanced diffusion (TED) of dopants, thus helping shallow junction formation. C implant parameters at this second shared level can comprise a dose from $1\times10^{14}$ cm$^{-2}$ to $2\times10^{15}$ cm$^{-2}$ at 4 to 8 keV. N is implanted in the source and drain region to reduce defects. In the case where p-type source and drain regions are formed for PMOS transistors, the boron species can be simultaneously implanted into top semiconductor surface 11 and the resistor polysilicon 40 at doses between $3\times10^{14}$ cm$^{-2}$ to $3\times10^{16}$ cm$^{-2}$, along with optional neutral and/or electrically inactive dopants such as Ge implant (as a PAI), and/or C to confine the profile to achieve a shallow junction. The energy and dose range for Ge and C is similar to the n-type case, and the same ranges can be used.

Figure 1E:
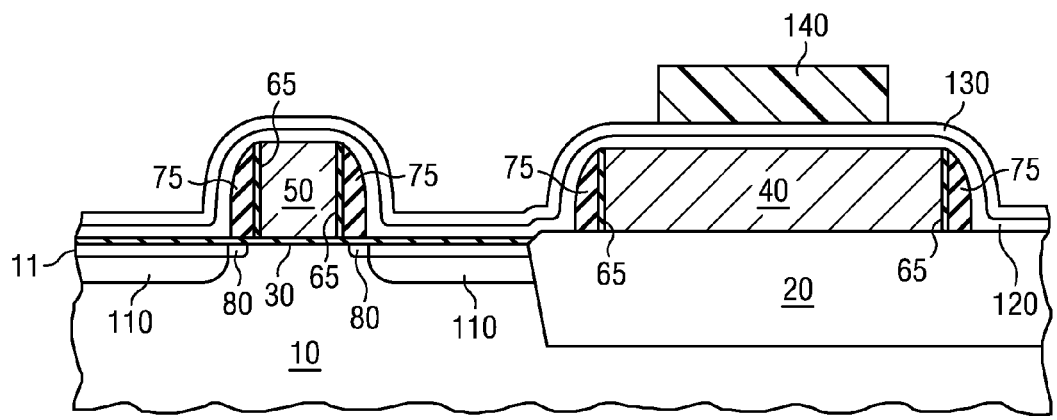

Following the formation of the MOS transistor source and drain regions 110, a silicon nitride layer 120 can be formed over the structure of FIG. 1*d* as shown in FIG. 1*e*. The silicon nitride layer 120 can be formed using known methods and is generally between 50 and 150 angstroms thick. An optional silicon oxide layer 130 can be formed over the silicon nitride layer 120. The silicon oxide layer can be formed using chemical vapor deposition (CVD) and can be between 75 to 500 angstroms thick. A patterned photoresist layer 140 is shown formed above the resistor polysilicon 40 to mask a portion of the underlying silicon nitride layer 120 and optional silicon oxide layer 130 during the subsequent etch processes. Although not shown, the patterned photoresist layer 140 can cover the entire topside of the resistor polysilicon 40, if subsequently siliciding described below is desired to be avoided across the top surface of the resistor polysilicon 40.

Figure 1F:
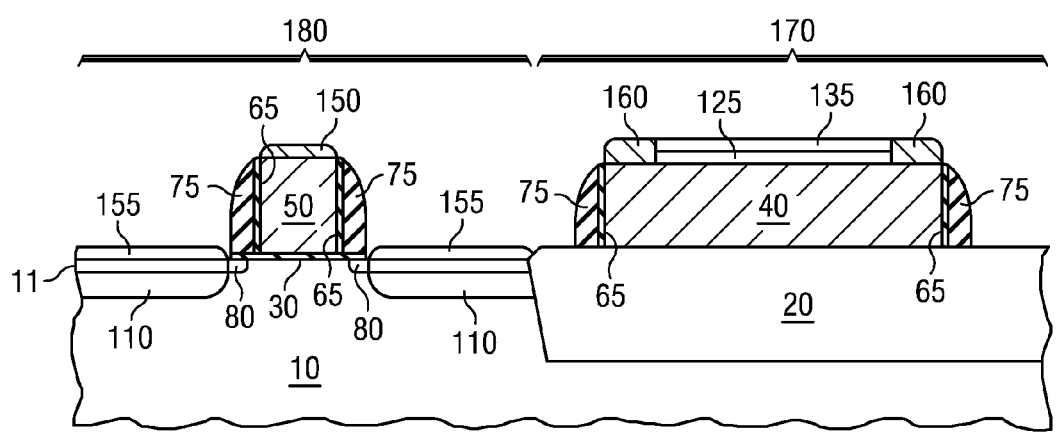

Following the formation of the patterned photoresist layer 140, the exposed regions of the optional silicon oxide layer 130 and the underlying silicon nitride layer are etched leaving the patterned silicon oxide layer 135 and the patterned silicon nitride layer 125 on the upper surface of the resistor polysilicon 40 as shown in FIG. 1*f*. The exposed regions of the optional silicon oxide layer 130 can be etched using a buffered hydrofluoric acid etch. The exposed regions of the silicon nitride layer 120 can then be etched using plasma based etch processes. After the resist is removed, an HF dip and pre-sputter etch can be used to remove any remaining native or chemical oxide on the silicon regions that are to be silicided, including any remaining dielectric layer 30 on the source and drain regions. The optional oxide layer can be included to reduce or prevent any thinning of the nitride layer over the resistor polysilicon 40.

The metal silicide regions 150, 155 and 160 are formed following the formation of the patterned optional silicon oxide layer 135 and the patterned silicon nitride layer 125 as shown in FIG. 1*f*, with the overall structure shown as IC 190. The metal silicide regions 160 shown on the first and second portions of the top surface of resistor polysilicon 40 provides first and second head regions for low resistance connections to the metal interconnect, such as to metal 1 (not shown). The metal silicide regions 150, 155, and 160 are formed by first forming a blanket metal layer over the structure. The metal used to form the blanket layer can comprise titanium, cobalt, tungsten, nickel, or any other suitable metal. Following the formation of the blanket metal layer, the metal is reacted with the underlying exposed silicon regions of the gate polysilicon 50, the source and drain regions 110, and the resistor polysilicon 40. The reaction between the metal layer and the underlying silicon is initiated by heating the structure above a certain critical temperature. In an embodiment where the metal formed comprises cobalt, the structure is heated to a temperature greater than 500° C.

Following the reaction between the metal layer and the underlying silicon the unreacted metal can be removed using a chemical etch (or strip) process. For the embodiment where cobalt is reacted with the underlying silicon to form a cobalt silicide, a sulfuric peroxide mixture (SPM) can be used in the chemical etch process to remove the un-reacted cobalt, followed by a solution of ammonium hydroxide and hydrogen peroxide (standard clean 1 (SC1)) to remove particles. Following the chemical etch process an anneal is performed by heating the silicide structures to temperatures greater than 680° C. The resulting fully formed metal silicide regions 150, 155, and 160 are shown in FIG. 1*f*. The patterned silicon nitride layer 125 and the optional patterned silicon oxide layer 135 will block the formation of a metal silicide in those regions of the resistor polysilicon 40 covered by the layers 125 and 135. The SIBLK poly resistor 170 comprises the doped resistor polysilicon 40, the patterned silicon nitride layer 125 the optional patterned silicon oxide layer 135, and the metal silicide regions 160. Electrical contact to the SIBLK poly resistor 170 is made through the metal silicide regions 160. Electrical contact to the MOS transistor 180 includes contacts through the gate polysilicon 50 and the source drain 110 metal silicide regions 150 and 155, respectively. Formation and/or patterning of one and typically a plurality of metal and dielectric layers generally follows siliciding so that IC 190 also includes multi-layer metallization.

For embodiments where the SIBLK poly resistor is doped p-type, and the MOS transistor is a p-channel MOS transistor, the first and second shared implant both generally include B as a dopant and Ge as a neutral dopant (such as for PAI). For the p-type doped embodiment, other neutral dopants such as C can also be used. Example implant parameters comprise B 1.0 to 2.5 keV, with a dose of $1\times10^{15}$ to $6\times10^{15}$ cm$^{-2}$; Ge: 15 keV, with a dose of $1\times10^{14}$ to $2\times10^{15}$ cm$^{-2}$; and C 3 to 9 keV, with a dose $1\times10^{14}$ to $2\times10^{15}$ cm$^{-2}$.

Figure 2:
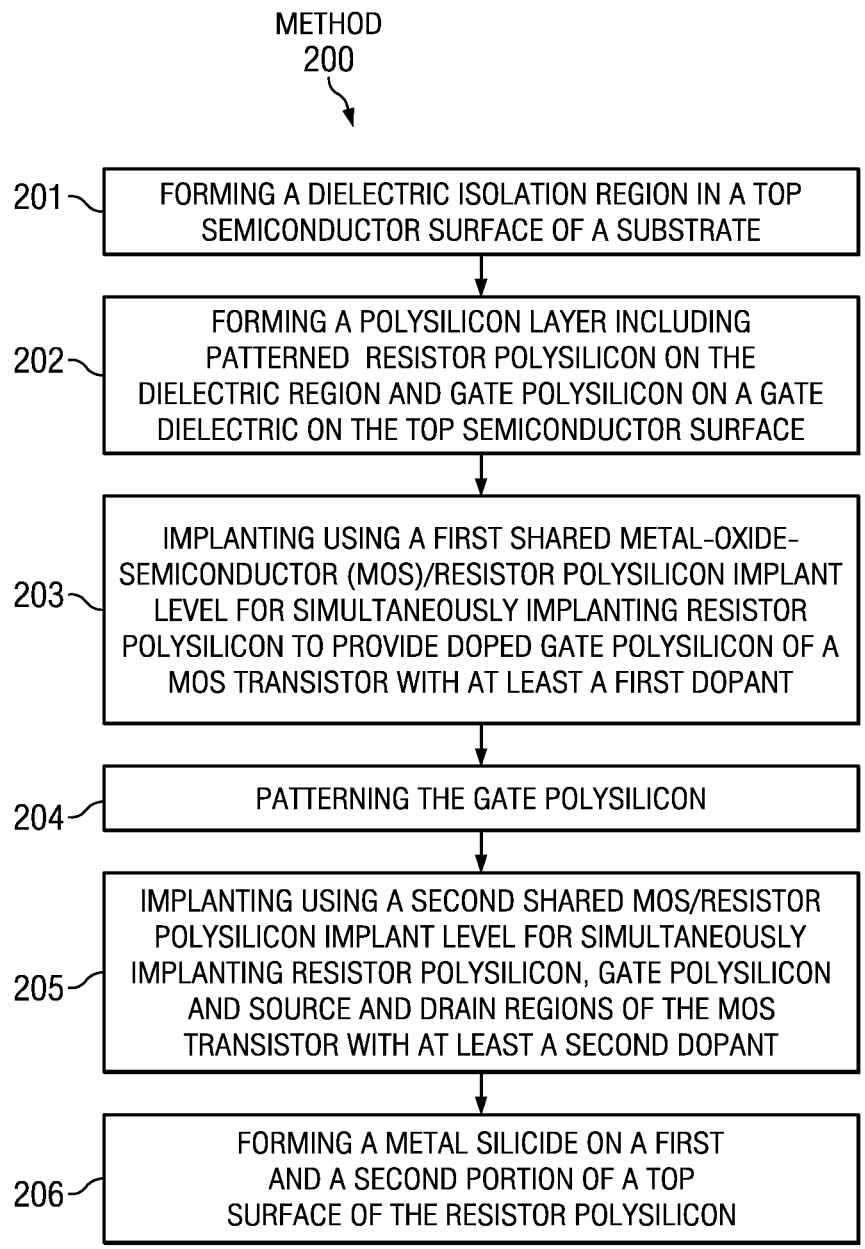
FIG. 2 is a flow chart that shows steps in an example method for forming an IC including a SIBLK poly resistor, according to an example embodiment.

FIG. 2 is a flow chart that shows steps in an example method 200 for forming an integrated circuit (IC) including a silicide block poly resistor (SIBLK poly resistor). Step 201 comprises forming a dielectric isolation region 20 in a top semiconductor surface 11 of a substrate 10. Step 202 comprises forming a polysilicon layer including patterned resistor polysilicon 40 on the dielectric isolation region and gate polysilicon 50 on a gate dielectric 30 on the top semiconductor surface 11.

Step 203 comprises implanting using a first shared metal-oxide-semiconductor (MOS)/resistor polysilicon implant level for simultaneously implanting the patterned resistor polysilicon 40 and the (unpatterned) gate polysilicon of a MOS transistor with at a first dopant. The gate polysilicon is then patterned in step 204. Step 205 comprises implanting using a second shared MOS/resistor polysilicon implant level for simultaneously implanting the resistor polysilicon 40, gate polysilicon 50 and source and drain regions 110 of a MOS transistor with at least a second dopant. The first dopant and the second dopant can include one or more common species, such as both including P and As in an n-type SIBLK poly resistor embodiment. Step 206 comprises forming a metal silicide on a first and second portion of the top surface of the resistor polysilicon 40 to provide head regions to complete formation of the SIBLK poly resistor 170.

Figure 3:
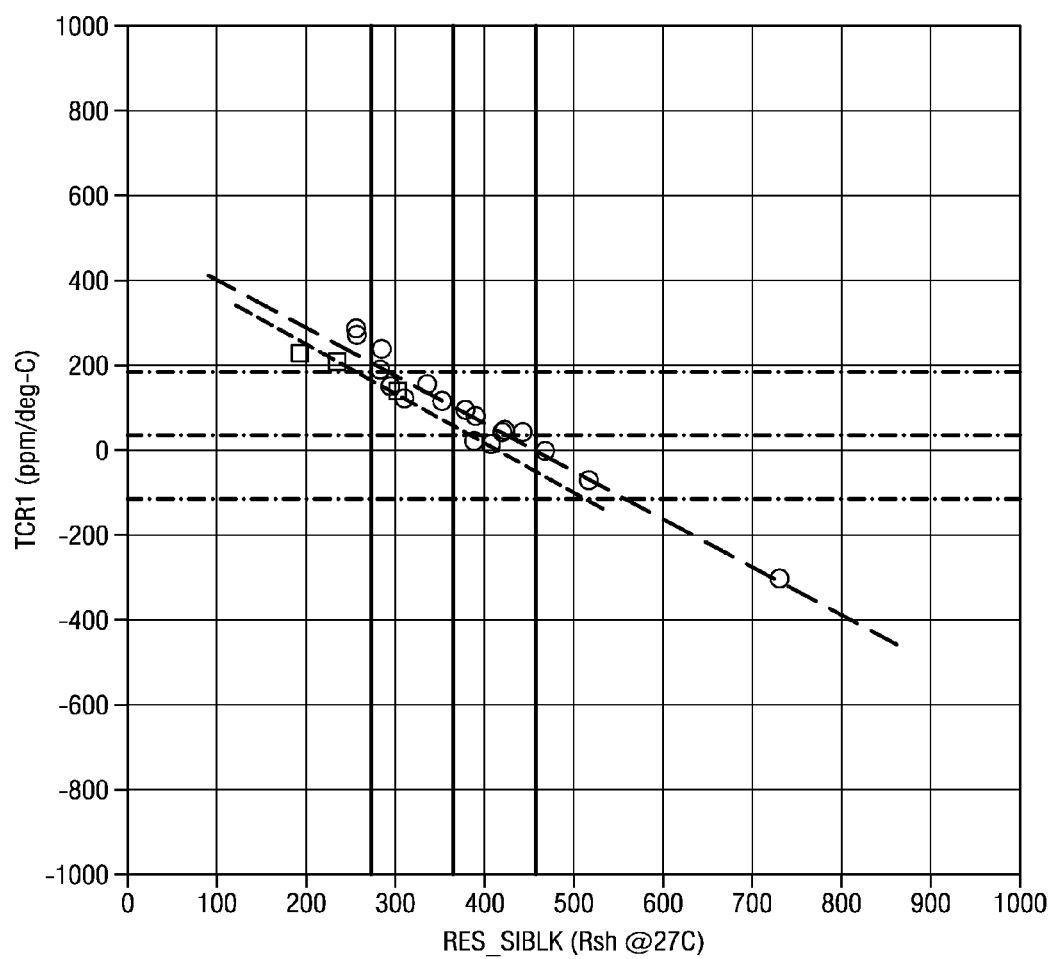
FIG. 3 shows data evidencing a tunable TCR and sheet resistance (Rsh) for disclosed SIBLK poly resistors, according to example embodiments.

FIG. 3 shows data evidencing a tunable TCR (in ppm/° C.) and sheet resistance (Rsh) for disclosed SIBLK poly resistors that utilize the above described first and second shared implant steps to dope the SIBLK poly resistor, according to example embodiments. There were anneals between the respective shared implant steps, comprising poly-reox, and LDD anneals and after the second shared implant a SD anneal was used. The anneal after first shared implant was a 750° C. to 850° C., furnace anneal or ISSG oxidation until the $SiO_2$ layer thickness was to 12-18 A. The LDD anneal: was a 950° C. Spike, or laser spoke anneal (LSA) at 1200° C. to −1300° C., and the anneal after S/D implants comprised a LSA at 1250° C., or LSA at 1150° C. plus an LSA at 1250° C.

Neutral or electrically inactive dopant implants were used in each shared implant step. Differing As and P parameters were found to allow the TCR/Rsh to "slide" along "TCR vs. Rsh" curve, and adding N to allow a vertical move (reducing TCR) of the TCR vs. Rsh curve. This allows tunable Rsh and TCR. The best SIBLK poly resistor TCR performance was found when the first shared implant included Ge, As, P and N.

The TCR for conventional single implant step doped SIBLK poly resistors is known to generally be n-poly doped only, or NSD doped only, or PSD doped only. Disclosed first and second shared implants can thus be seen to provide an additional approximately 150 ppm/deg ° C. reduction in TCR compared to a conventional single step doped SIBLK-R that receives a pre-gate n-poly implant only. Disclosed first and second shared implants thus provide an additional knob to reduce TCR. Moreover, since dopants go into disclosed SIBLK poly resistors starting at pre-gate implants and followed by multiple step anneals, there is less sensitivity to the S/D anneal conditions compared to a SIBLK resistor doped by S/D implants only.

Regarding gate leakage current (Jg) reduction for MOS transistors, it was found disclosed embodiments using 4 dopants, Ge, As, P and N used for the first shared implant level provided a Jg reduction of 40% to 90% with a slight (~0.3 A) increase in Toxinv for NMOS transistors. Based on Ioff vs. Idrive and Ioff vs. Idlin curves obtained for core and I/O MOS transistors, no degradation was found as compared to compared to 1 or 2 implants (P, or Ge and P for n-poly doping.

The active circuitry formed on the substrate having a semiconductor surface comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method for forming an integrated circuit (IC) including a silicide block poly resistor (SIBLK poly resistor), comprising:
    forming an dielectric isolation region in a top semiconductor surface of a substrate;
    forming a polysilicon layer including a patterned polysilicon resistor disposed entirely on said dielectric isolation region and gate polysilicon on a gate dielectric on said top semiconductor surface;
    implanting using a first shared metal-oxide-semiconductor (MOS)/resistor polysilicon implant level for simultaneously implanting said patterned polysilicon resistor and said gate polysilicon of a MOS transistor with at least a first dopant;
    then, patterning said gate polysilicon to form a polysilicon transistor gate;
    then, implanting using a second shared MOS/resistor polysilicon implant level for simultaneously implanting said patterned polysilicon resistor, said gate polysilicon, and source and drain regions of said MOS transistor with at least a second dopant, and
    forming a metal silicide on a first and second portion of a top surface of said patterned polysilicon resistor to form said SIBLK poly resistor.

2. The method of claim 1, further comprising forming sidewall structures adjacent to said polysilicon resistor and said gate polysilicon after said first shared implant level before said second shared implant level.

3. The method of claim 1, further comprising at least one annealing at between 750° C. and 1300° C. between said first shared implant level and said second shared implant level.

4. The method of claim 1, wherein said first shared implant level further comprises implanting with at least a first neutral dopant, and wherein said first neutral dopant comprises Ge in a dose from $5\times10^{13}$ $cm^{-2}$ to $1\times10^{15}$ $cm^{-2}$ at an energy from 10 to 30 keV.

5. The method of claim 4, wherein said SIBLK poly resistor is doped n-type, said MOS transistor is a n-channel MOS transistor, and said first neutral dopant further comprises N in a dose from $4\times10^{14}$ $cm^{-2}$ to $6\times10^{15}$ $cm^{-2}$ at an energy of 5 to 20 keV, wherein said Ge and N are implanted into both the patterned polysilicon resistor and the gate polysilicon as part of the first shared implant level.

6. The method of claim 1, wherein said first dopant comprises P with a dose from $1\times10^{15}$ $cm^{-2}$ to $1\times10^{16}$ $cm^{-2}$ at 1 to 12 keV, and As with a dose from $7\times10^{14}$ $cm^{-2}$ to $6\times10^{15}$ $cm^{-2}$ at 5 to 25 keV.

7. The method of claim 1, wherein said SIBLK poly resistor is doped n-type, said MOS transistor is a n-channel MOS transistor, and wherein said second shared implant level further comprises implanting Ge then said second dopant, wherein said second dopant comprises P and As, and wherein the Ge is simultaneously implanted into the patterned polysilicon resistor, the gate polysilicon, and source and drain regions of said MOS transistor.

8. The method of claim 7, wherein said second shared implant level further comprises implanting N with a dose $1\times10^{15}$ cm$^{-2}$ to $2\times10^{15}$ cm$^{-2}$ at 8 to 12 keV.

9. The method of claim 1, wherein said SIBLK poly resistor is doped p-type, said MOS transistor is a p-channel MOS transistor, and said first dopant and said second dopant both comprise B.

10. A method for forming an integrated circuit including a silicide block poly resistor (SIBLK poly resistor), comprising:
   forming a dielectric isolation region in a top semiconductor surface of a substrate, wherein said top semiconductor surface comprises silicon;
   forming a polysilicon layer including a patterned polysilicon resistor entirely on said dielectric isolation region and gate polysilicon on a gate dielectric on said top semiconductor surface;
   implanting using a first shared metal-oxide-semiconductor (MOS)/resistor polysilicon implant level for simultaneously implanting said patterned polysilicon resistor and said gate polysilicon of a n-channel MOS transistor with at least a first n-type dopant and a first co-dopant;
   then, patterning said gate polysilicon to form a polysilicon transistor gate;
   forming sidewall structures adjacent to polysilicon layer after said first shared implant;
   after said forming said sidewall structures, implanting using a second shared MOS/resistor polysilicon implant level for simultaneously implanting said polysilicon layer, said gate polysilicon and source and drain regions of said MOS transistor with at least a second n-type dopant and a second co-dopant, and
   forming a metal silicide on a first and second portion of a top surface of said patterned polysilicon resistor to form said SIBLK poly resistor,
   wherein said source and drain regions, said gate polysilicon and said patterned polysilicon resistor all include Ge and N.

11. The method of claim 10, wherein said source and drain regions, said gate polysilicon and said patterned polysilicon resistor all include P and As.

* * * * *